(12) United States Patent
Kachroo et al.

(10) Patent No.: US 11,234,325 B2
(45) Date of Patent: Jan. 25, 2022

(54) PRINTED CIRCUIT BOARD HAVING A DIFFERENTIAL PAIR ROUTING TOPOLOGY WITH NEGATIVE PLANE ROUTING AND IMPEDANCE CORRECTION STRUCTURES

(71) Applicant: Infinera Corporation, Annapolis Junction, MD (US)

(72) Inventors: Aneesh Kachroo, San Jose, CA (US); Mithun Gopal V V, Bangalore (IN); Navneeth Jayaraj, Bangalore (IN)

(73) Assignee: Infinera Corporation, San Jose, CA (US)

( * ) Notice: Subject to any disclaimer, the term of this patent is extended or adjusted under 35 U.S.C. 154(b) by 0 days.

(21) Appl. No.: 16/447,558

(22) Filed: Jun. 20, 2019

(65) Prior Publication Data

US 2020/0404774 A1    Dec. 24, 2020

(51) Int. Cl.
*H05K 1/00*     (2006.01)
*H05K 1/02*     (2006.01)
(Continued)

(52) U.S. Cl.
CPC ......... *H05K 1/0225* (2013.01); *H05K 1/0245* (2013.01); *H05K 1/112* (2013.01);
(Continued)

(58) Field of Classification Search
CPC ... H05K 1/00; H05K 1/02; H05K 1/11; H05K 1/18; H05K 1/112; H05K 1/115;
(Continued)

(56) References Cited

U.S. PATENT DOCUMENTS 4,543,715 A    10/1985  Iadarola et al.
6,047,469 A *   4/2000  Luna .................... G01R 1/0408
                                                29/830
(Continued)

FOREIGN PATENT DOCUMENTS

EP    1 696 482       2/2006
JP      2630308 B2    7/1997
JP    2000004086      1/2000

OTHER PUBLICATIONS

PCT Search Report and Written Opinion for PCT/US2016/018682 dated Jul. 12, 2016.
(Continued)

*Primary Examiner* — Xiaoliang Chen
(74) *Attorney, Agent, or Firm* — David L. Soltz

(57) ABSTRACT

A printed circuit board including a set of five layers encompassing a breakout area is described. The set includes a first ground layer, a first signal layer having a first conductive layer within the breakout area, a second ground layer having conductive material, a second signal layer having a second conductive layer within the breakout area, and a third ground layer. The second ground layer having a void forming a differential pair being two parallel traces, and being separated into a first portion positioned within the breakout area and a second portion outside of the breakout area. The differential pair having a first width and a first spacing within the breakout area and a second width and second spacing outside of the breakout area, with the second width greater than the first width. The first and second conductive layers forming a first ground plane and a second ground plane.

7 Claims, 7 Drawing Sheets

(51) Int. Cl.
  *H05K 1/11* (2006.01)
  *H05K 1/18* (2006.01)
  *H05K 3/42* (2006.01)
  *H05K 3/46* (2006.01)
  *H01L 21/48* (2006.01)
  *H01L 23/66* (2006.01)
  *H01L 23/498* (2006.01)
  *H05K 3/20* (2006.01)

(52) U.S. Cl.
  CPC .............. *H05K 3/20* (2013.01); *H05K 3/4658* (2013.01); *H05K 2201/093* (2013.01); *H05K 2201/09227* (2013.01); *H05K 2201/09236* (2013.01); *H05K 2201/09609* (2013.01); *H05K 2201/09727* (2013.01)

(58) Field of Classification Search
  CPC . H05K 1/181; H05K 3/42; H05K 3/46; H01L 21/48; H01L 23/66; H01L 23/498
  USPC ................ 174/262, 251, 261, 266; 333/246; 361/262, 251, 261, 266
  See application file for complete search history.

(56) References Cited

U.S. PATENT DOCUMENTS

| | | | |
|---|---|---|---|
| 6,137,064 A | 10/2000 | Kiani et al. | |
| 6,534,872 B1 | 3/2003 | Freda et al. | |
| 6,541,712 B1 | 4/2003 | Gately et al. | |
| 6,593,535 B2 | 7/2003 | Gailus | |
| 6,594,811 B2 | 7/2003 | Katz | |
| 6,713,685 B1 | 3/2004 | Cotton | |
| 6,891,272 B1 | 5/2005 | Fjelstad | |
| 7,168,164 B2 | 1/2007 | Jessep et al. | |
| 7,169,640 B2 | 1/2007 | Wallace | |
| 7,275,316 B2 | 10/2007 | Myers et al. | |
| 7,358,470 B2 | 4/2008 | Wang et al. | |
| 7,378,601 B2 | 5/2008 | Hsu et al. | |
| 7,457,132 B2 | 11/2008 | Gisin et al. | |
| 7,470,864 B2 | 12/2008 | Ho et al. | |
| 8,076,588 B2 * | 12/2011 | Hirakawa | H05K 1/112 174/261 |
| 8,222,537 B2 | 7/2012 | Dudnikov, Jr. et al. | |
| 8,541,884 B2 | 9/2013 | Conn et al. | |
| 8,604,357 B2 | 12/2013 | Takeda | |
| 8,674,489 B2 | 3/2014 | Bolis et al. | |
| 8,715,006 B2 | 5/2014 | Jeon | |
| 8,835,226 B2 | 9/2014 | Morris et al. | |
| 9,035,197 B2 | 5/2015 | Ao | |
| 9,040,831 B2 | 5/2015 | Ishida et al. | |
| 2005/0133251 A1 | 6/2005 | Chiu | |
| 2005/0161255 A1 | 7/2005 | Takada | |
| 2007/0017697 A1 | 1/2007 | Hsu | |
| 2007/0033457 A1 | 2/2007 | Park | |
| 2007/0089292 A1 | 4/2007 | Tourne et al. | |
| 2007/0089902 A1 | 4/2007 | Tourne | |
| 2008/0295041 A1 * | 11/2008 | Zhou | H05K 1/0262 716/132 |
| 2009/0057912 A1 | 3/2009 | Kheng | |
| 2009/0079523 A1 * | 3/2009 | Hsu | H05K 1/0253 333/246 |
| 2009/0233461 A1 | 9/2009 | Tourne | |
| 2011/0297432 A1 * | 12/2011 | Xie | H05K 1/0218 174/262 |
| 2012/0306597 A1 | 12/2012 | Kushta | |
| 2013/0112470 A1 * | 5/2013 | Ao | H05K 1/0251 174/266 |
| 2013/0214397 A1 * | 8/2013 | Kawai | H05K 1/0251 257/664 |
| 2013/0215587 A1 * | 8/2013 | Kawai | H05K 1/0225 361/783 |
| 2013/0279135 A1 * | 10/2013 | Isono | H05K 1/181 361/774 |
| 2014/0133115 A1 * | 5/2014 | Iguchi | H05K 1/0243 361/760 |
| 2015/0208514 A1 | 7/2015 | Thomas et al. | |
| 2015/0359084 A1 * | 12/2015 | Kashiwakura | H05K 1/0253 333/246 |
| 2016/0246458 A1 | 8/2016 | Hart et al. | |
| 2019/0088388 A1 * | 3/2019 | Baba | H01P 3/08 |
| 2019/0096798 A1 * | 3/2019 | Aleksov | H01L 23/49838 |

OTHER PUBLICATIONS

Extended European Search Report regarding EP Patent Appl. No. 16753147.4, dated Nov. 8, 2018.
PCT International Search Report and Written Opinion regarding PCT/US17/47860, dated Jan. 26, 2018.

* cited by examiner

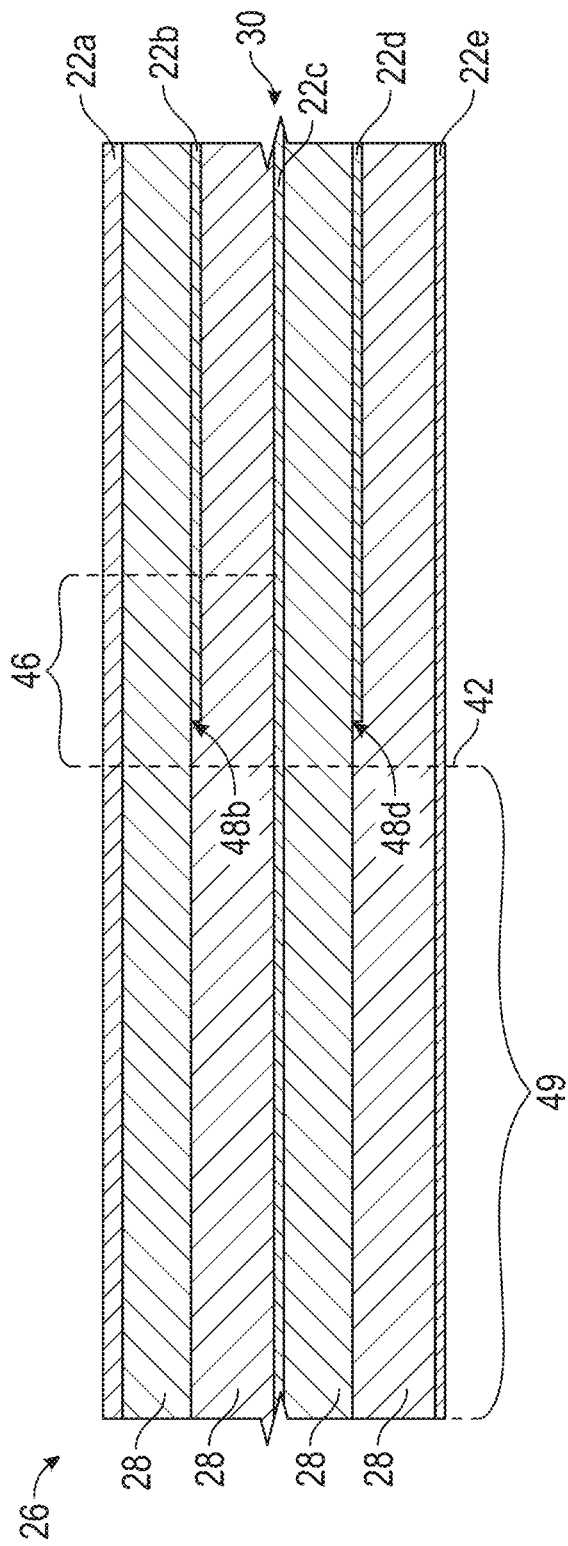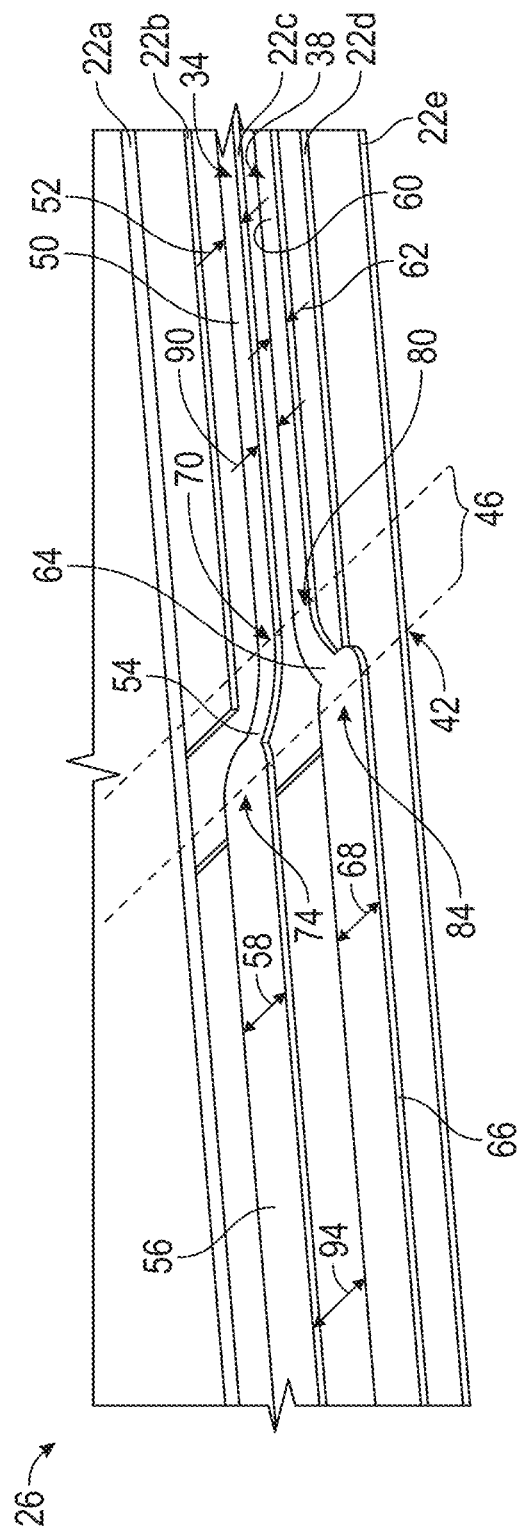

PRINTED CIRCUIT BOARD HAVING A DIFFERENTIAL PAIR ROUTING TOPOLOGY WITH NEGATIVE PLANE ROUTING AND IMPEDANCE CORRECTION STRUCTURES

BACKGROUND

Printed circuit boards are widely known in the art and are used for forming a wide variety of types of electrical devices. Printed circuit boards typically comprise a number of layers of conductors which are interconnected by conductive holes. There has been a trend to provide PCBs having increasingly higher circuit density and higher circuit speed. In high-speed high-density PCBs, the electrical signal integrity is determined in part by the trace length of the differential pairs transmitting the electrical signal.

To help meet the demand for a stable electrical signal, it has been proposed to increase circuit density. A shorter trace length requires that components are more densely packed on the PCB, either because the trace length requires the component receiving the electrical signal be nearer the transmitter or because the electrical signal integrity requires that an amplifier be added to the PCB to boost the electrical signal for a longer trace length.

Thus, a need exists for a PCB device having a structure that can accommodate longer differential pair traces while maintaining electrical signal integrity and minimizing PCB complexity and costs.

SUMMARY

The problem of accommodating longer differential pair traces while maintaining electrical signal integrity and minimizing PCB complexity and costs is solved with the methods and systems described herein, including a printed circuit board having a set of five layers encompassing a breakout area. The breakout area has a plurality of spatially disposed vias arranged in a grid pattern with routing lanes positioned between adjacent pairs of vias, and within the breakout area. The five layers include a first ground layer; a first signal layer having a first conductive layer within the breakout area; a second ground layer having conductive material; a second signal layer having a second conductive layer within the breakout area; and a third ground layer. The second ground layer has a void forming a differential pair. The void is an absence of conductive material. The differential pair being two parallel traces, and being separated into a first portion positioned within a routing lane of the breakout area and a second portion within a negative plane routing region outside of the breakout area. The differential pair has a first width and a first spacing within the breakout area and a second width and second spacing within the negative plane routing region, with the second width greater than the first width, and the differential pair having the first conductive layer forming a first ground plane and the second conductive layer forming a second ground plane for the differential pair within the breakout area.

BRIEF DESCRIPTION OF SEVERAL VIEWS OF THE DRAWINGS

The accompanying drawings, which are incorporated in and constitute a part of this specification, illustrate one or more implementations described herein and, together with the description, explain these implementations. The drawings are not intended to be drawn to scale, and certain features and certain views of the figures may be shown exaggerated, to scale or in schematic in the interest of clarity and conciseness. Not every component may be labeled in every drawing. Like reference numerals in the figures may represent and refer to the same or similar element or function. In the drawings:

FIG. 2A is a two-dimensional, cross-sectional view of a portion of an exemplary embodiment of the printed circuit board constructed in accordance with the present disclosure.

FIG. 2B is a three-dimensional, perspective, exploded view of a portion of an exemplary embodiment of the printed circuit board constructed in accordance with the present disclosure.

DETAILED DESCRIPTION

Figure 1:
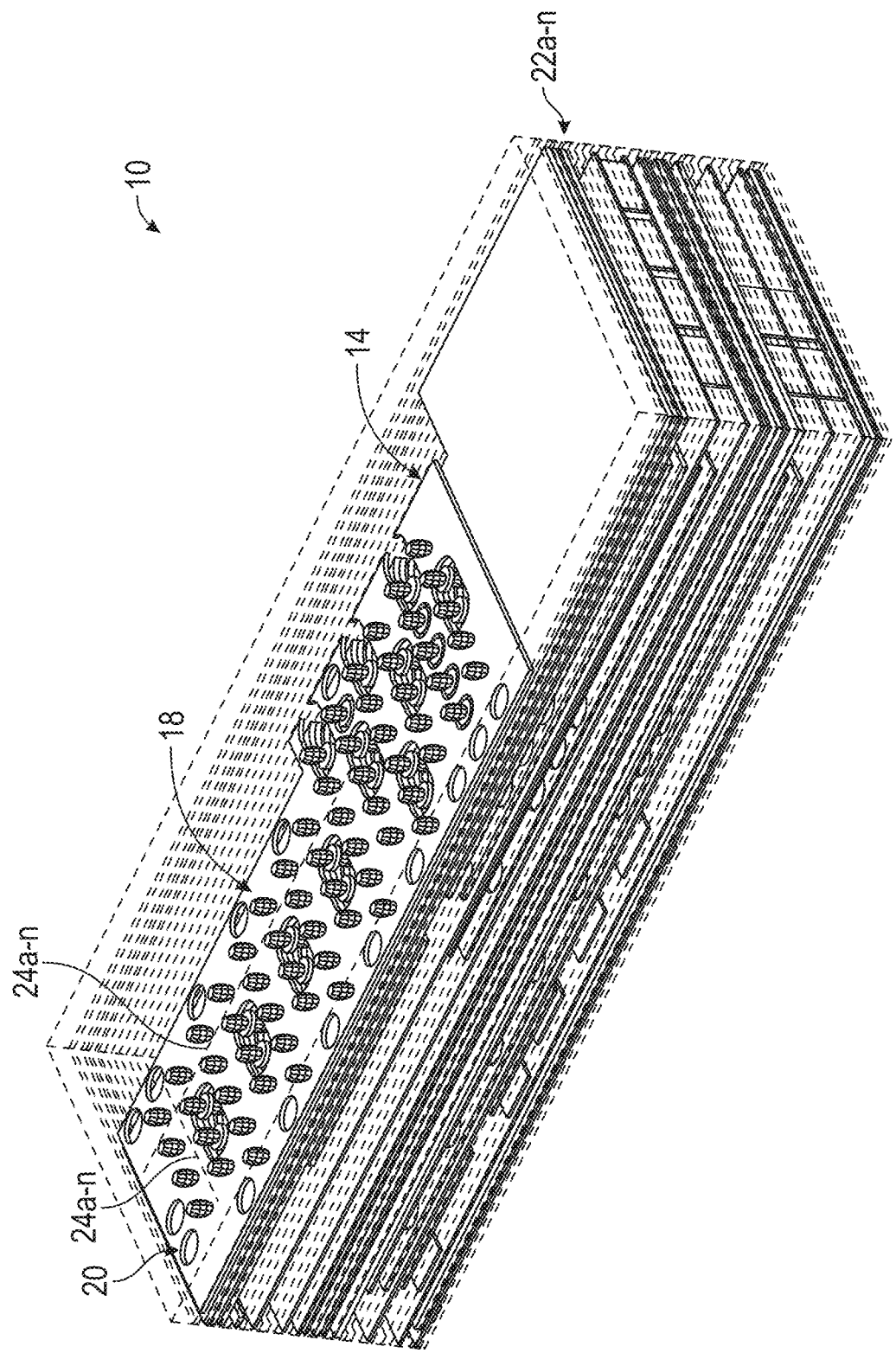
FIG. 1 is a three-dimensional, exploded, perspective view of a portion of an exemplary embodiment of a printed circuit board constructed in accordance with the present disclosure.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The disclosure is capable of other embodiments or of being practiced or carried out in various ways. Also, it is to be understood that the phraseology and terminology employed herein is for purposes of description and should not be regarded as limiting.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements but may also include other elements not expressly listed or inherent to such process, method, article, or apparatus.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, qualifiers like "substantially," "about," "approximately," and combinations and variations thereof, are intended to include not only the exact amount or value that they qualify, but also some slight deviations therefrom, which may be due to computing tolerances, computing error, manufacturing tolerances, measurement error, wear and tear, stresses exerted on various parts, and combinations thereof, for example.

As used herein, any reference to "one embodiment," "an embodiment," "some embodiments," "one example," "for example," or "an example" means that a particular element, feature, structure or characteristic described in connection with the embodiment is included in at least one embodiment and may be used in conjunction with other embodiments. The appearance of the phrase "in some embodiments" or "one example" in various places in the specification is not necessarily all referring to the same embodiment, for example.

The use of ordinal number terminology (i.e., "first", "second", "third", "fourth", etc.) is solely for the purpose of differentiating between two or more items and, unless explicitly stated otherwise, is not meant to imply any sequence or order of importance to one item over another.

The use of the term "at least one" or "one or more" will be understood to include one as well as any quantity more than one. In addition, the use of the phrase "at least one of X, Y, and Z" will be understood to include X alone, Y alone, and Z alone, as well as any combination of X, Y, and Z.

The term "PCB" as used herein means a printed circuit board. The term "trace" as used herein means a conductive path on at least one layer of the printed circuit board that extends from a first location to a second location. The trace is composed of one or more conductive material.

Differential pairs have at least two substantially parallel traces and may include one or more ground common to both traces. The traces transmit information encoded within a signal utilizing differential signaling. Differential signaling is a method for electrically transmitting information using two complementary signals, e.g. a first signal S1 complements a second signal S2 such that S2=−S1. The differential signaling method sends the same electrical signal as a differential pair of signals, each in its own trace. Information transmitted utilizing differential signals is received by measuring the voltage between the differential pair. Because the differential signaling uses complementary signals, the traces of the differential pair are of the same length, and each trace is routed adjacent (parallel) to the other trace, the transmitted information is resistant to electromagnetic interference and other common-mode shift interferences. As used herein, the term "differential pair trace" means the set of traces in the differential pair.

In order to ensure each of the differential pair of signals maintain a complementary state between the other, traditional methods teach differential signal routing rules including, in part: route high-speed differential pair signals on the top or bottom layer of the PCB with an adjacent ground layer; do not use stripline routing of high-speed differential routing; and maintain constant trace width after the Ball Grid Array (BGA) breakout area to avoid impedance mismatches in the transmission lines, for example in "High-Speed Interface Layout Guidelines, Rev. H," by Texas Instruments (Application Report SPRAAR7H-August 2014-Revised October 2018).

A Serializer/Deserializer (SerDes) is an interface that may be used in high-speed signaling to provide information over a differential pair trace by converting parallel data into serialized data that is output over a high-speed connection and converting serialized data that is received over a high-speed connection into parallel data for processing. The higher the number of SerDes, the greater the difficulty of routing the high-speed 100 ohm differential pairs in high density on traditional trace geometries of 107.95 μm-279.4 μm-107.95 μm, Width-Space-Width (4.25-11-4.25 in mils). In order to maintain a signal integrity, the total signal loss should not be greater than 7.3 dB for "Very Short Reach" channels.

The selection of trace geometry is governed by the number of routing layers and the overall board thickness that can be tolerated by the mechanical design as well as by manufacturing capabilities and tolerances. Additionally, trace geometry may be selected based on the target impedance of the differential pair. Traditionally, the most suitable of these trace geometries for high-speed 100 ohm differential pair routing was of 107.95 μm-279.4 μm-107.95 μm, Width-Space-Width (4.25-11-4.25 in mils).with a loss of 0.44 dB per cm (1.12 dB per inch) at 14 GHz in a 30-layer stack-up with 10 high-speed signal routing and would utilize nearly 3.302 mm (130 mil) board thickness with a dielectric material sold under the trademark MEGTRON 6. However, utilizing this trace geometry results in the need for an active component, such as a signal amplifier, to ensure signal stability. With the traditional PCB design, a total signal loss of 7.304 dB is reached when the trace length is 12.14 cm (4.78 in.) thereby conforming to the requirements for "Very Short Reach" channels of Optical Interfacing Forum's September 2014, "White Paper: Multi-Vendor Interoperability Testing of CFP4, QSFP28, and backplanes with CEI-28G-VSR and CEI-25G-LR Interface During ECOC 2014 Exhibition."

TABLE 1

Showing Loss per Inch for various Stripline Structure options.

| Stripline structure W − S − W (mils) | Pitch (E − E) (mils) | Stack Height Single Stripline (mils) | Material | Foil Type | Loss/inch 7 GHz | Loss/inch 14 GHz |
|---|---|---|---|---|---|---|
| 8.5 − 8.5 − 8.5 | 25.5 | 20.68 | MEG6 | HVLP | 0.45 | 0.71 |
| 6.25 − 8.75 − 6.25 | 21.25 | 13.75 | MEG6 | HVLP | 0.47 | 0.77 |
| 5.25 − 9.75 − 5.25 | 20.25 | 10.32 | MEG6 | HVLP | 0.54 | 0.97 |
| 4.25 − 11 − 4.25 | 19.5 | 9.22 | MEG6 | HVLP | 0.67 | 1.12 |
| 4 − 13 − 4 | 21 | 9.08 | MEG4 | RTF | 0.87 | 1.48 |

The phrase "Negative Plane Routing", as used herein, describes routing a trace in a ground conductive layer of a Printed Circuit Board. To implement negative plane routing, a channel is etched on a ground conductive layer forming a void allowing a differential pair trace to exist in the void while isolating the differential pair trace from the remaining conductive material on the ground conductive layer. The differential pair routed in the ground conductive layer will use the next most adjacent, non-etched, ground conductive layers as a reference. As discussed in more detail below, Negative Plane Routing can be used to create and route a differential pair trace in a ground plane layer.

Referring now to the drawings, and in particular to FIG. 1, shown therein and designated by a general reference numeral 10, is a printed circuit board constructed in accordance with the present disclosure. The printed circuit board 10 is provided with a breakout area 14, a plurality of contact pads 18, a plurality of vias 20 (see FIG. 3), and a plurality of layers 22a-n. The vias 20 connect respective ones of the contact pads 18 to particular traces on the layers 22a-n within the printed circuit board 10. The contact pads 18 are located within the breakout area 14 and may be part of the via 20, that is, the contact pads 18 may connect traces on the layers 22a-n within the printed circuit board 10.

Figure 3:
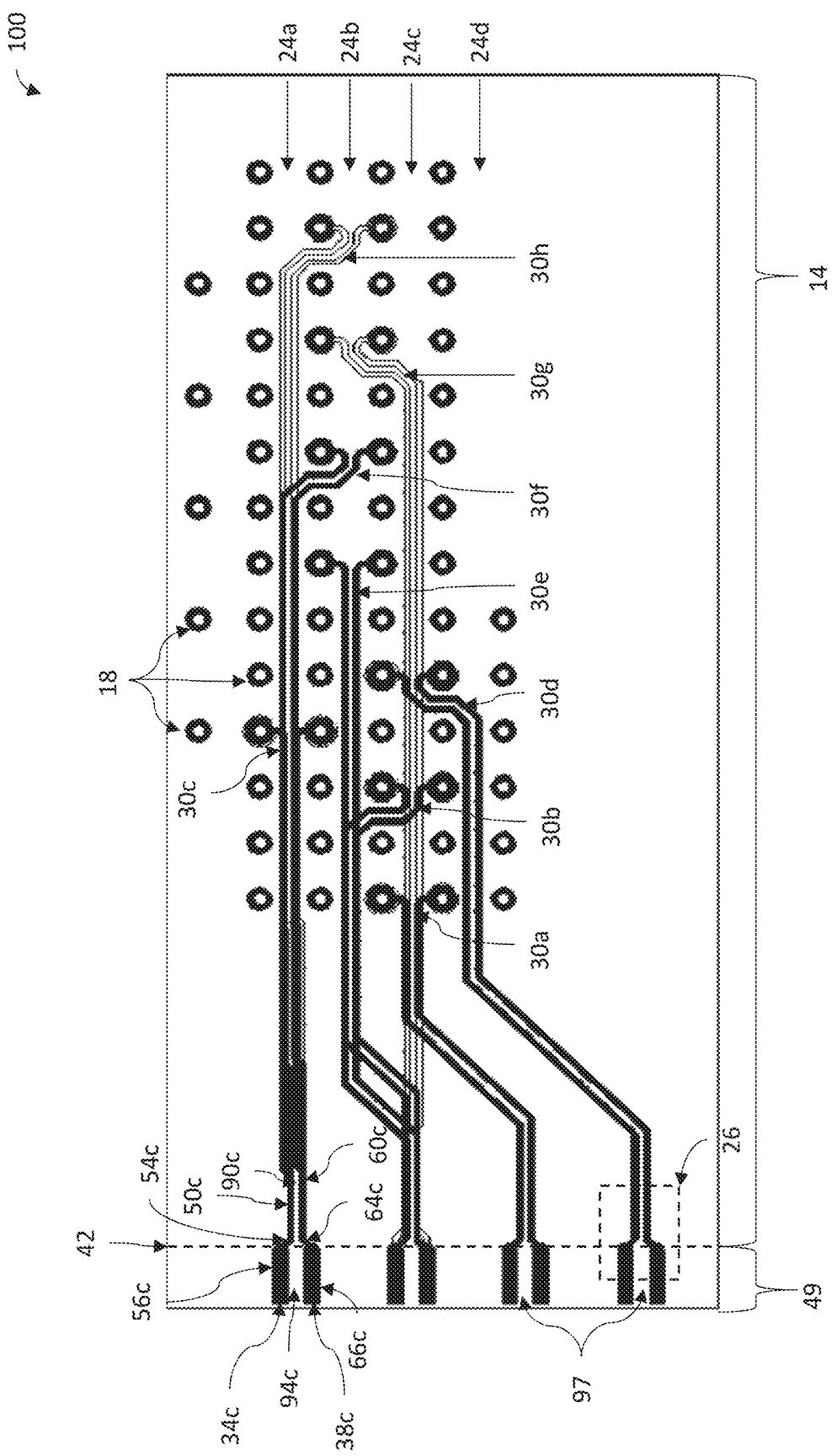
FIG. 3 is a top-view schematic of a plurality of traces of different layers in an exemplary embodiment of the printed circuit board constructed in accordance with the present disclosure.

The breakout area 14 is a portion of the printed circuit board 10 configured to be connected to an external integrated circuit (not shown). An example of the breakout area 14 is shown in FIG. 3. The breakout area 14 has a plurality of vias 20 spatially disposed in a grid pattern with routing lanes 24a-n positioned between adjacent pairs of vias 20 to support connection of the integrated circuit to the printed circuit board 10. The breakout area 14 can include any material or device configured to support electrical components, conductors, and the like. In one preferred embodiment, the breakout area 14 includes multiple layers 22a-n with interleaved traces and insulators.

The contact pads 18 can be any type of material or device capable of providing an electrical connection or contact to an external component, such as an integrated circuit. For example, the contact pad 18 can be a surface mount contact, or a ball grid array contact, or solder mask defined common mode contact. The contact pad 18 can be in the form of round, oval, or multi-sided shapes depending on the optimum routing and bonding criteria.

The plurality of vias 20 are metallized, or conductive, holes formed in the printed circuit board 10. The metallized holes can be in different forms, such as micro vias, buried vias, blind vias and through-hole vias, all of which are known in the art. Techniques for making and using micro vias, buried vias, blind vias, and through-hole vias are known in the art. In the typical cases, the hole has a single function: the plating in the hole connects all conductive layers exposed in the hole to each other or the hole is used for component insertion. Vias have also served dual purposes such as providing layer-to-layer interconnection and through-hole component mounts.

Referring now to FIGS. 2A and 2B, shown in FIG. 2A and designated by reference numeral 26 is an enlarged two-dimensional cross-sectional view of a section of the printed circuit board 10 in accordance with the present disclosure. The printed circuit board section 26 is provided with a plurality of conductive layers 22a-n comprising a first ground layer 22a, a first signal layer 22b, a second ground layer 22c, a second signal layer 22d, and a third ground layer 22e. Each of the plurality of layers 22a-n is separated by a filling material 28, such as a dielectric bonding material known in the art as "pre-preg." The second ground layer 22c is constructed to form a ground differential pair 30 utilizing Negative Plane Routing. The ground differential pair 30 includes a first trace 34 and a second trace 38 (shown in FIG. 2B). The printed circuit board section 26 includes a transition boundary 42 at a perimeter of the breakout area 14, and the ground differential pair 30 includes a transition zone 46. In one embodiment, the transition zone 46 is located at the transition boundary 42. Also, the transition boundary 42 marks a location past which all traces on the first signal layer 22b and the second signal layer 22d in the breakout area 14 terminate. The first signal layer 22b and the second signal layer 22d extend about and substantially encompass the breakout area 14 and have an outer edge 48b and 48d that terminates at the transition boundary 42.

Each of the plurality of conductive layers 22a-n may be constructed of any type of conductive material that is suitable for providing the electrical connection between an internal trace or conductive path, and another internal or external conductive path or trace, with or without external contact pads. Typically, the conductive layer 22 will be constructed of copper or gold. However, it should be understood that other materials and/or alloys of materials and or combinations of different materials can be utilized in forming the conductive layers 22a-n.

The filling material 28 acts as a dielectric between at least two of the plurality of conductive layers 22. The filling material 28 is desirably formed of a material having chemical and thermal compatibility with the breakout area 14 fabrication processes and materials and is desirably compatible with the various plating baths employed. Also, the filling material 28 should exhibit sufficient flow characteristics in order to fill small aspect ratio plated through-holes (or blind holes) and have the ability to be transformed, cured or converted into a solid material, with a minimal volume change after filling. The thermal expansion of the filling material 28 should be compatible with the rest of the breakout area 14. Furthermore, the filling material 28 should exhibit good adhesion to the barrel of plated vias, or through-holes.

Shown in FIG. 2B is an enlarged, three-dimensional, cross-sectional view of the printed circuit board section 26 of the printed circuit board 10 shown in FIG. 2A. The printed circuit board section 26 is provided with five or more conductive layers 22a-n. The layers of the printed circuit board section 26 generally have the first ground layer 22a, the first signal layer 22b, the second ground layer 22c forming the ground differential pair 30 having the first trace 34 and the second trace 38, the second signal layer 22d, and the third ground layer 22e.

The area outside the breakout area 14 may be referred to as a negative plane routing region 49. The first trace 34 and the second trace 38 of the ground differential pair 30 may be of the same length, and the first trace 34 may extend adjacent to and substantially parallel with the second trace 38. The first trace 34 and the second trace 38 of the ground differential pair 30 may have a difference in trace length less than or equal to 127 μm (5 mil). The first trace 34 has a first portion 50 with a first width 52, a transition portion 54 within the transition zone 46, and a second portion 56 with a second width 58. The second trace 38 has a first portion 60 with a first width 62, a transition portion 64 within the transition zone 46, and a second portion 66 with a second width 68. The first portions 50 and 60 extend within the breakout area 14. The second portions 56 and 66 extend outside of the breakout area 14 and extend within the negative plane routing region 49. The transition portions 54 and 64 are located between the first portions 50 and 60 and the second portions 56 and 66 within the transition zone 46. The first portions 50 and 60 have first widths 52 and 62 that are substantially equivalent and that are relatively smaller than the second widths 58 and 68 of the second portions 56 and 66, the second widths 58 and 68 also being substantially equivalent. The first widths 52 and 62 of the first portions 50 and 60 are configured to extend within the routing lanes 24a-n. The transition portions 54 and 64 are located within the transition zone 46 and outside of the routing lanes 24a-n, however, and cause a transition in width from the first width 52 to the second width 58 and from the first width 62 to the second width 68. Also shown is the transition boundary 42 that marks an outer boundary of the breakout area 14. In one embodiment, the transition zone 46 is located at the transition boundary 42. Also, the transition boundary 42 marks a location past which all traces on the first signal layer 22b and the second signal layer 22d have connected to a contact pad 18.

The transition portion 54 has a variable width and is formed from a pre-transition segment 70 and a post-transition segment 74. The pre-transition segment 70 is connected to the first portion 50 and the post-transition segment 74. Similarly, the transition portion 64 has a variable width and is formed from a pre-transition segment 80 and a post-transition segment 84. The pre-transition segment 80 is connected to the first portion 60 and the post-transition segment 84.

In one embodiment, the pre-transition segment 70 extends away from the pre-transition segment 80 to increase spacing from a first spacing 90 between the first portion 50 and the first portion 60 to a second spacing 94 between the second portion 56 and 66. Likewise, the pre-transition segment 80 extends away from the pre-transition segment 70. In the embodiment shown, the pre-transition segments 70 and 80 are symmetrical, and shaped so as to be mirror images. In one embodiment, the pre-transition segments 70 and 80 are arcuately shaped.

Figure 2C:
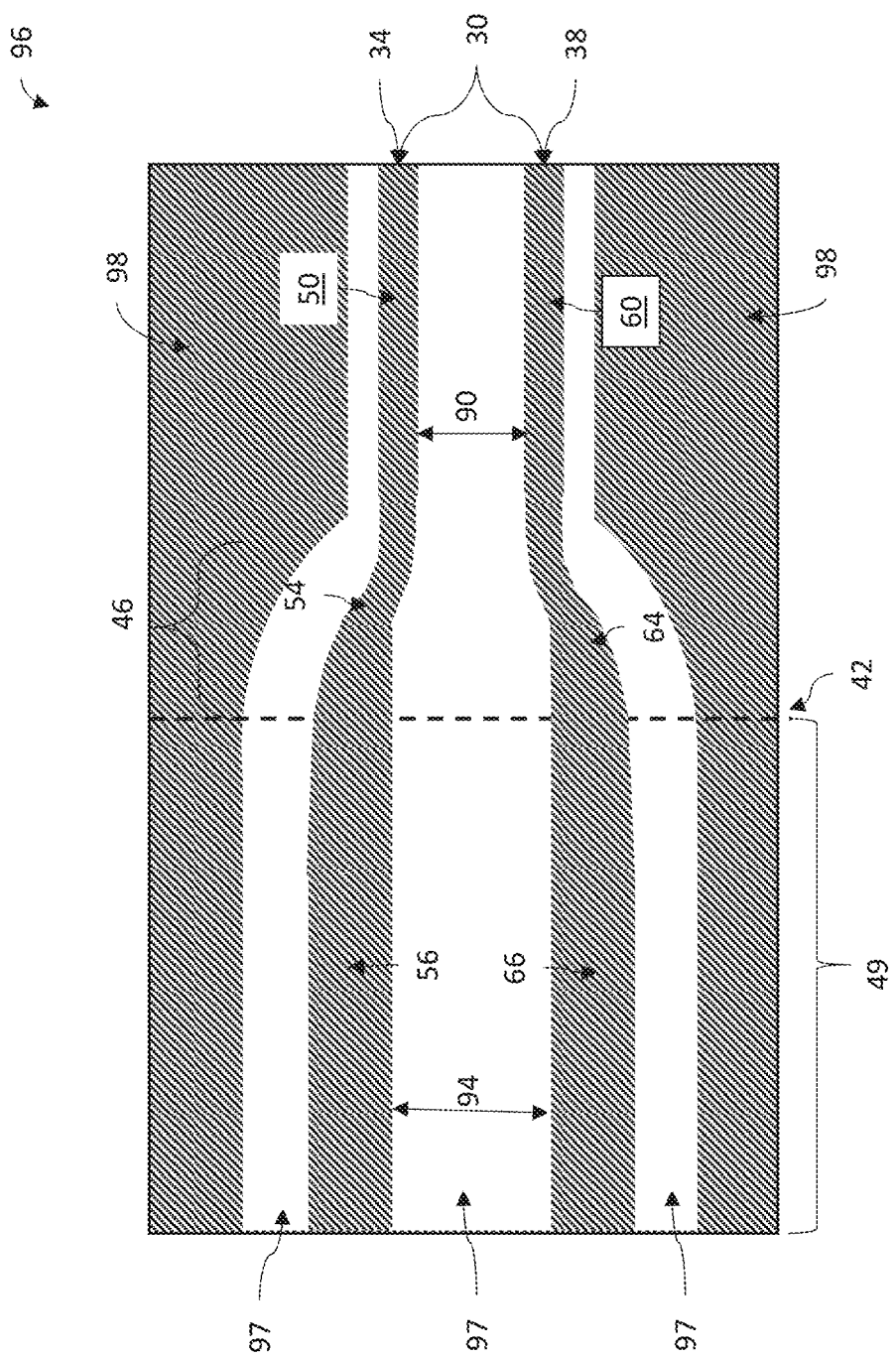
FIG. 2C is a two-dimensional top-view of an exemplary embodiment of a ground plane formed utilizing negative plane routing.

Referring now to FIG. 2C shown therein and designated by numeral 96 is a top-view of the second ground layer 22c showing the ground differential pair 30 routed in accordance with negative plane routing. The differential ground pair 30 has the first trace 34 and the second trace 38 routed in a void 97 formed by removing conductive material 98. The first trace 34 has the first portion 50, the transition portion 54 within the transition zone 46, and the second portion 56. The second trace 38 has the first portion 60, the transition portion 64 within the transition zone 46, and the second portion 66. Also shown is the first spacing 90 between the first portion 50 and the first portion 60 and the second spacing 94 between the second portion 56 and the second portion 66. The void 97 may be filled with a dielectric material such as the filling material 28.

Referring now to FIG. 3 shown therein and designated by numeral 100 is a top-view schematic of a plurality of ground differential pairs routed in lanes 24a-d and on different layers 22a-n in an exemplary embodiment of a schematic of the printed circuit board 10. Also shown in FIG. 3 is a top-view schematic of the printed circuit board section 26 and its relationship to the surrounding printed circuit board 10. The schematic 100 shows the plurality of contact pads 18, the transition boundary 42, the breakout area 14, and differential pairs 30a, 30b, 30c, 30d, 30e, 30f, 30g, and 30h. In this example, even though the traces appear to intersect in the top-view, the traces are formed on different layers such that they do not intersect with one another. For example, the differential pairs 30a, 30b, 30c, and 30d may be routed on one of the conductive ground layers 22, differential pairs 30e and 30f may be routed on another one of the conductive ground layer 22, and differential pairs 30g and 30h may be routed on yet another conductive ground layer 22. For the differential pair 30c, FIG. 3 shows the first spacing 90c and the second spacing 94c, the first portion 50c, the transition portion 54c, and the second portion 56c for the first trace 34c and the first portion 60c, the transition segment 64c, and the second portion 66c for the second trace 38c. For purposes of clarity, reference numerals showing particular features of the differential pairs 30a, 30b, 30d, 30e, 30f, 30g, and 30h have not been provided.

In one embodiment, the first width 52 is 88.9 µm (3.5 mil), the first width 62 is 88.9 µm (3.5 mil), and the first spacing 90 is 101.6 µm (4 mil) and the second width 68 is 228.6 µm (9 mil), the second width 58 is 228.6 µm (9 mil), and the second spacing 94 is 279.4 µm (11 mil). Simulations show this embodiment allows routing high-speed 100 ohm differential signals with loss as low as 0.303 dB per cm (0.77 dB per inch) at 14 GHz, a loss reduction of around 41.6% from the conventional approach. This embodiment of the printed circuit board 10 further provides for a trace structure of 228.6 µm-279.4 µm-228.6 µm, Width-Space-Width. (9-11-9 in mil) in the Negative Plane Routing region 49 and maintains compliance with mechanical designs and manufacturing tolerances and capabilities. With an embodiment of the disclosed printed circuit board 10, a total signal loss of 7.307 dB is reached when the trace length is 19.38 cm (7.63 in.). Compared to the conventional PCB, this disclosed PCB increases the trace length by 7.24 cm (2.85 in.), a more than 37% increase in length, while maintaining total signal loss at the loss threshold of 7.3 dB. Moreover, implementing this approach allows for an increase in the trace length, which eliminates the need for signal amplifiers to maintain the signal integrity. Eliminating signal amplifiers reduces routing complexity, thereby reducing costs, and increases available printed circuit board space.

Figure 4:
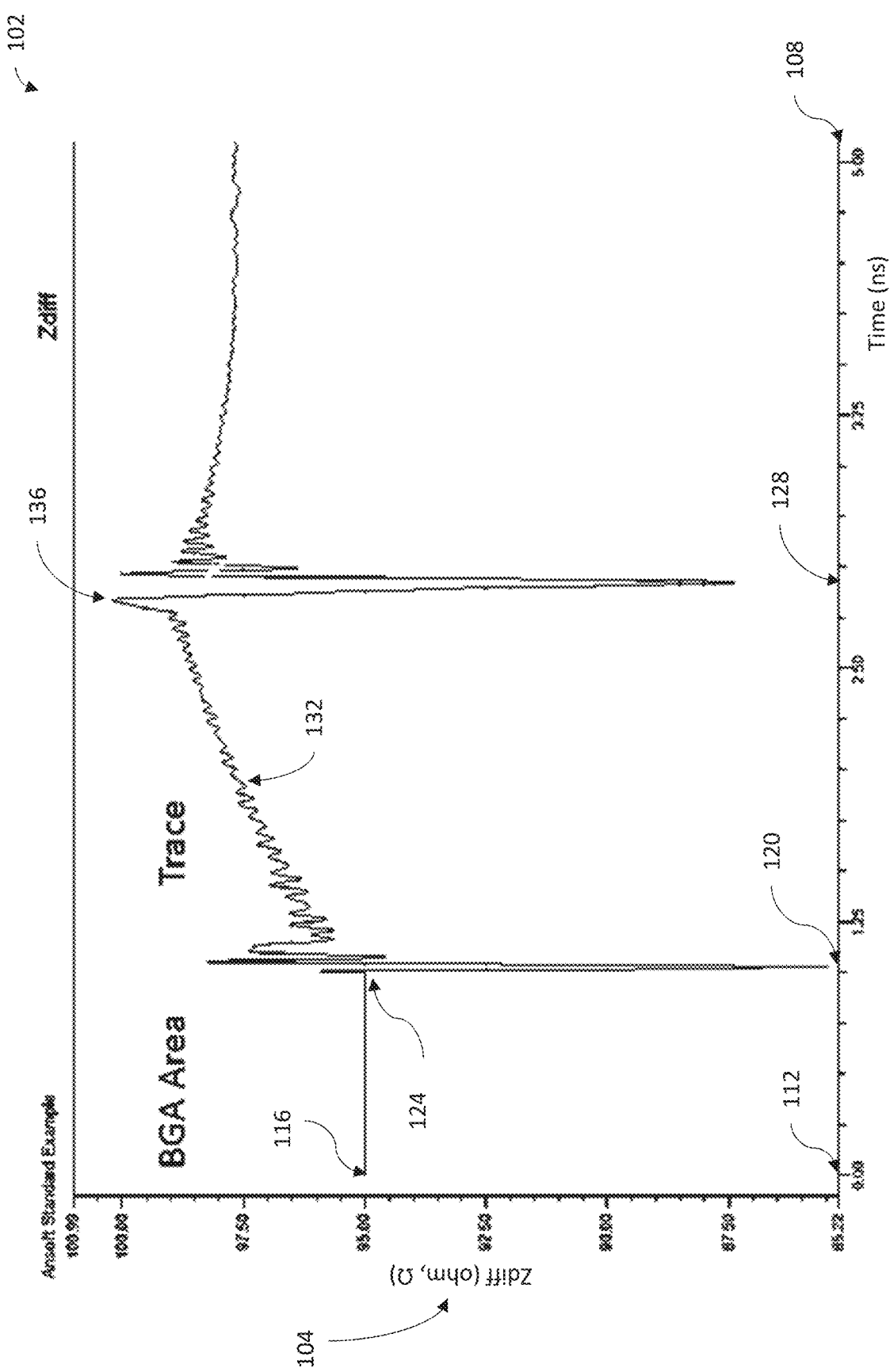
FIG. 4 is an example of time-domain reflectometer response of a specific disclosure of an exemplary embodiment of the printed circuit board constructed in accordance with the present disclosure.

Refer now to FIG. 4 shown therein and designated by numeral 102 is an example of a computer simulated time-domain reflectometer (TDR) response graph of a specific example of an exemplary embodiment of the printed circuit board 10 constructed in accordance with the present disclosure. The chart measures the Zdiff 104 in ohms of the ground differential pair 30 at specified time 108 in nanoseconds (ns). The Zdiff 104 at time 0 ns 112 is 95 ohms 116 and corresponds to the Zdiff of the signal between the first portion 50 of the first trace 34 and the first portion 60 of the second trace 38. Starting at time 1 ns 120, the Zdiff 104 has a large signal variance 124 over a short period of time corresponding to the signal passing from the relatively narrower first portions 50 and 60 through the transition zone 46 (across the pre-transition segments 70 and 80 to the post-transition segments 74 and 84) to the relatively wider second portions 56 and 66. Between time 1 ns 120 and time 2.8 ns 128, the Zdiff 104 increases and oscillates shown by the Zdiff range 132. It is between time 1 ns 120 and time 2.8 ns 128 that the signal is traveling through the negative plane routing region 49 along the wide differential pair trace formed by the second portions 56 and 66 of the ground differential pair 30 routed in accordance with the Negative Plane Routing technique. At time 2.8 ns 128, the Zdiff 104 again has a large signal variance 136 over a short period of time corresponding to the signal passing a second transition boundary on a receiving component. The Simulated TDR Response graph 102 confirms that, as the signal crosses the transition boundary 42, the signal maintains integrity.

Figure 5:
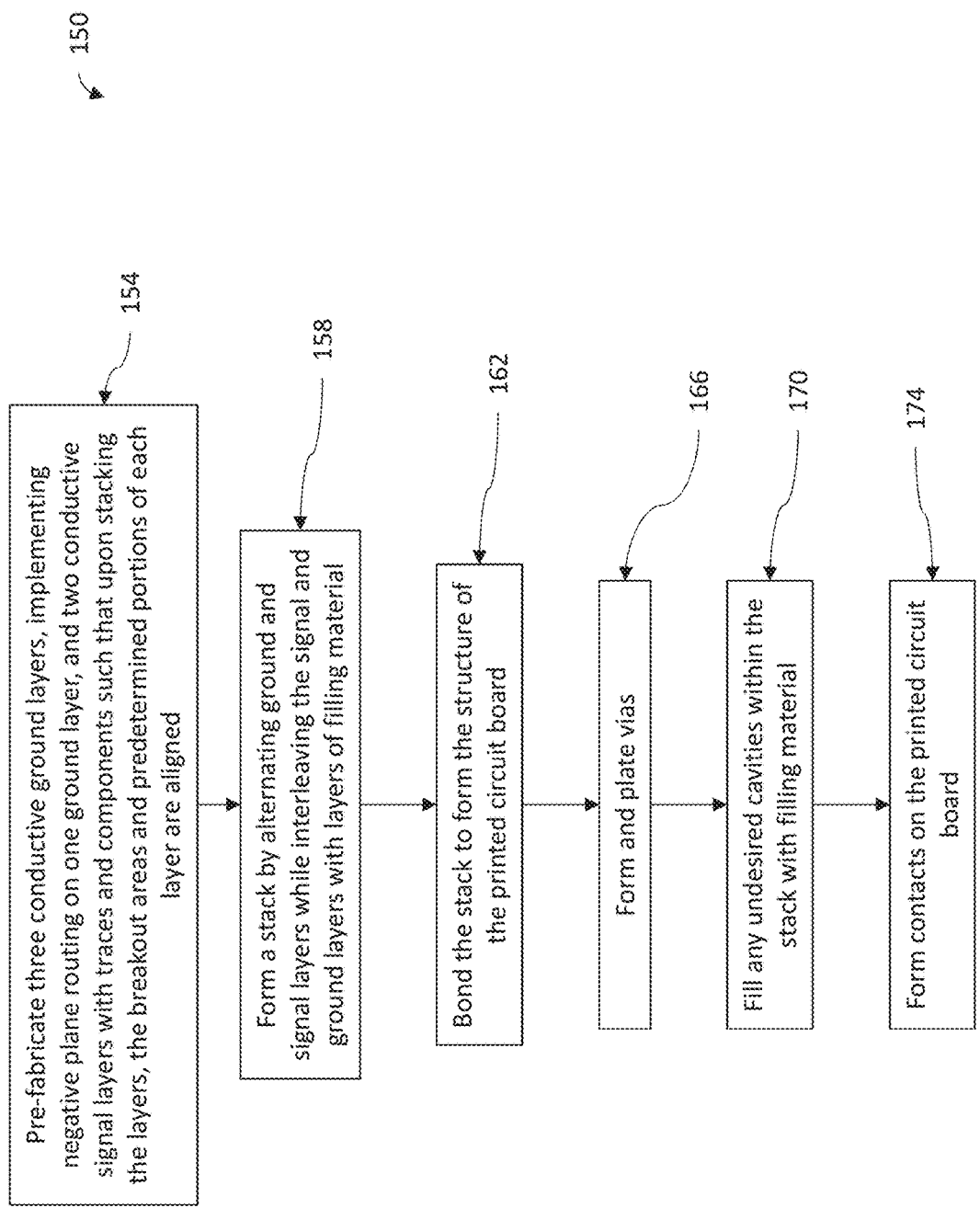
FIG. 5 is an exemplary embodiment of a process for making the printed circuit board of the instant disclosure depicted in FIG. 1.

Refer now to FIG. 5 shown therein and designated by numeral 150 is an exemplary embodiment of a process for making the printed circuit board 10 of the instant disclosure, an example of which is depicted in FIG. 1. The process for making the printed circuit board 10 generally follows the steps of: pre-fabricating at least three conductive ground layers, implementing negative plane routing on the center ground layer, and two conductive signal layers with traces and components such that upon stacking the layers, the breakout areas and traces of each layer are aligned (step 154); forming a stack by alternating ground and signal layers around the center ground layer while interleaving the signal and ground layers with layers of filling material (step 158); bonding the stack to form the structure of the printed circuit board (step 162); forming and planting the vias (step 166), filling any undesired cavities within the stack with filling material (step 170) and forming contacts on the printed circuit board (step 174).

Figure 6:
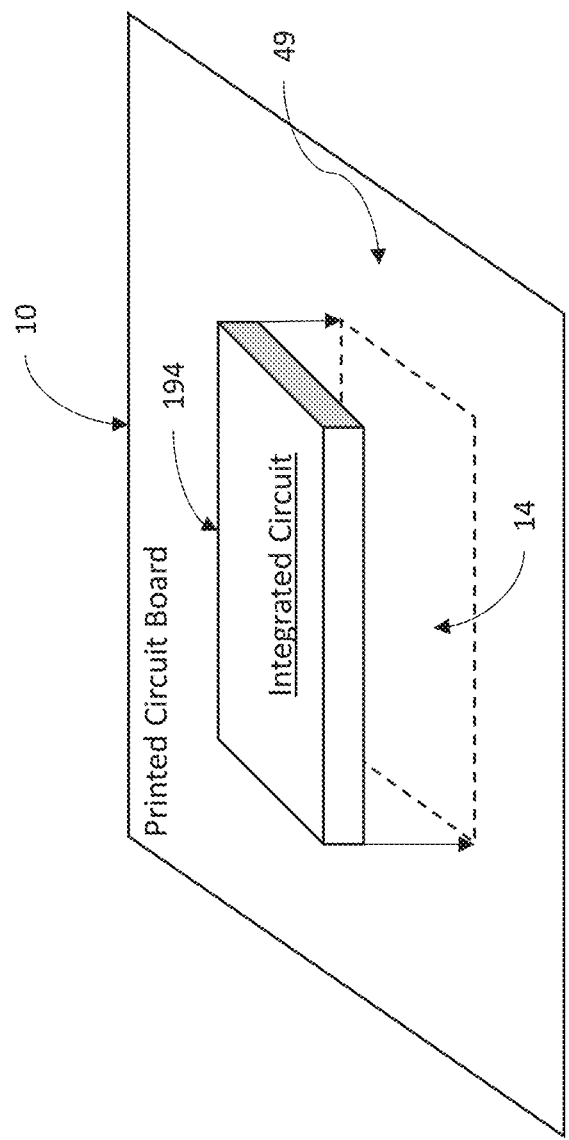
FIG. 6 is a three-dimensional, perspective, exploded view of an exemplary embodiment of a component, such as an integrated circuit, positioned within the breakout area of the printed circuit board constructed in accordance with the present disclosure.

Referring now to FIG. 6 shown therein and designated by numeral 190 is a three-dimensional, perspective, exploded view of an exemplary embodiment of a component, such as an integrated circuit 194, positioned within the breakout area 14 of the printed circuit board 10. The integrated circuit 194 connects to the plurality of contact pads 18 within the breakout area 14. Also shown is the relationship between the breakout area 14 and the negative plane routing region 49 within circuit board 10. In one embodiment, the integrated circuit 194 includes a SerDes interface that transmits high-speed signals on the differential pair 30 and requires a signal loss below a threshold of 7.3 dB.

From the above description, it is clear that the inventive concepts disclosed and claimed herein are well adapted to carry out the objects and to attain the advantages mentioned herein, as well as those inherent in the invention. While exemplary embodiments of the inventive concepts have been described for purposes of this disclosure, it will be understood that numerous changes may be made which will readily suggest themselves to those skilled in the art and which are accomplished within the spirit of the inventive concepts disclosed and claimed herein.

What is claimed is:

1. A printed circuit board, comprising:
  a set of five layers encompassing a breakout area having a plurality of spatially disposed vias arranged in a grid pattern with a routing lane positioned between an adjacent pairs of vias, and within the breakout area, the routing lane being a contiguous space on one or more of the five layers, the five layers comprising:
  a first ground layer;
  a first signal layer having a first conductive layer within the breakout area;
  a second ground layer having conductive material;
  a second signal layer having a second conductive layer within the breakout area; and
  a third ground layer; and
  the second ground layer having a void forming a differential pair, the void being an absence of conductive material, the differential pair being two parallel traces, and being separated into a first portion positioned within the routing lane of the breakout area and a second portion within a negative plane routing region outside of the breakout area, the differential pair having a first width and a first spacing within the breakout area and a second width and second spacing within the negative plane routing region, with the second width greater than the first width, and the differential pair having the first conductive layer forming a first ground plane and the second conductive layer forming a second ground plane for the differential pair within the breakout area.

2. The printed circuit board of claim 1, wherein the parallel traces include a first parallel trace having a first length, and a second parallel trace having a second length, and wherein the first length is within 5 mil of the second length.

3. The printed circuit board of claim 1, wherein the one of the parallel traces is a first trace having a transition portion located between and joining the first portion and the second portion, the transition portion having a non-uniform width.

4. The printed circuit board of claim 1, wherein the second spacing is greater than the first spacing.

5. The printed circuit board of claim 1, wherein the first width is substantially uniform throughout the first portion.

6. The printed circuit board of claim 1, wherein the second width is substantially uniform throughout the second portion.

7. The printed circuit board of claim 1, wherein the first width is about 88.9 μm (3.5 mil), the first spacing is about 101.6 μm (4 mil), the second width is about 228.6 μm (9 mil), and the second spacing is about 279.4 μm (11 mil).

* * * * *